(12) United States Patent
Du

(10) Patent No.: US 9,664,969 B2
(45) Date of Patent: May 30, 2017

(54) TFT-LCD DISPLAY PANEL BASED ON HSD STRUCTURE AND MANUFACTURING METHOD

(71) Applicant: SHENZHEN CHINA STAR OPTOELECTRONICS TECHNOLOGY CO., LTD., Shenzhen, Guangdong (CN)

(72) Inventor: Peng Du, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 178 days.

(21) Appl. No.: 14/406,699

(22) PCT Filed: Jun. 17, 2014

(86) PCT No.: PCT/CN2014/080122
§ 371 (c)(1),
(2) Date: Dec. 9, 2014

(87) PCT Pub. No.: WO2015/184654
PCT Pub. Date: Dec. 10, 2015

(65) Prior Publication Data
US 2016/0274431 A1  Sep. 22, 2016

(30) Foreign Application Priority Data

Jun. 5, 2014 (CN) .......................... 2014 1 0247733

(51) Int. Cl.
*H01L 27/14* (2006.01)
*G02F 1/1362* (2006.01)
(Continued)

(52) U.S. Cl.
CPC ...... *G02F 1/136286* (2013.01); *G02F 1/1368* (2013.01); *H01L 21/0217* (2013.01);
(Continued)

(58) Field of Classification Search
CPC ............. G02F 1/136286; G02F 1/1368; H01L 21/02592; H01L 21/02532
(Continued)

(56) References Cited

U.S. PATENT DOCUMENTS

| 2006/0290859 A1 | 12/2006 | Ko et al. |
| 2008/0042955 A1 | 2/2008 | Oke et al. ........................ 345/92 |
| 2009/0173942 A1 | 7/2009 | Hsiao et al. |

FOREIGN PATENT DOCUMENTS

| CN | 1722198 A | 1/2006 |
| CN | 101093329 A | 12/2007 |

(Continued)

OTHER PUBLICATIONS

Chinese Office Action with search report issued by the Chinese Patent Office, dated Mar. 28, 2016 in corresponding application 201410247733.5.

(Continued)

*Primary Examiner* — Anthony Ho
(74) *Attorney, Agent, or Firm* — Kim Winston LLP

(57) ABSTRACT

The present disclosure discloses a TFT-LCD display panel based on an HSD structure, including: a sub-pixel unit array; a plurality of pairs of gate lines, with each pair being arranged between two adjacent rows of the sub-pixel units, wherein each gate line includes subsections arranged repeatedly and the subsection is consist of subsection portions with different widths, on the wider subsection portion of which a TFT element connected with a pixel electrode of the sub-pixel unit is placed; a plurality of data lines perpendicular to the gate lines, wherein two or more columns of sub-pixel units are arranged between two adjacent data lines. TFT elements of the present disclosure are placed on the gate (Continued)

lines other than the pixel region, which increases the open rate of the pixel region, and thus improves the penetration rate of the pixels.

16 Claims, 3 Drawing Sheets

(51) Int. Cl.
    *G02F 1/1368*     (2006.01)
    *H01L 21/77*     (2017.01)
    *H01L 21/02*     (2006.01)
    *H01L 27/12*     (2006.01)
    *H01L 29/66*     (2006.01)

(52) U.S. Cl.
    CPC .... *H01L 21/0262* (2013.01); *H01L 21/02532* (2013.01); *H01L 21/02592* (2013.01); *H01L 21/77* (2013.01); *H01L 27/124* (2013.01); *H01L 27/1288* (2013.01); *H01L 29/66765* (2013.01); *G02F 2001/136295* (2013.01); *G02F 2201/40* (2013.01)

(58) Field of Classification Search
    USPC .......................................................... 257/72
    See application file for complete search history.

(56) References Cited

FOREIGN PATENT DOCUMENTS

| | | |
|---|---|---|
| CN | 101335272 A | 12/2008 |
| CN | 101718934 A | 6/2010 |
| CN | 101799605 A | 8/2010 |
| CN | 102681257 A | 9/2012 |
| CN | 103487994 A | 1/2014 |
| TW | 200931147 A | 7/2009 |

OTHER PUBLICATIONS

International Search Report dated Feb. 26, 2015.

TFT-LCD DISPLAY PANEL BASED ON HSD STRUCTURE AND MANUFACTURING METHOD

CROSS REFERENCE TO RELATED APPLICATIONS

The present application claims benefit of Chinese Patent Application CN201410247733.5, filed on Jun. 5, 2014 and entitled "TFT-LCD DISPLAY PANEL BASED ON HSD STRUCTURE AND MANUFACTURING METHOD", the entire contents of which are herein incorporated by reference.

FIELD OF THE INVENTION

The present disclosure relates to a design of liquid crystal panel, in particular to a TFT-LCD display panel with an HSD (Half Source Driving, Half Source Driving) structure and a method for manufacturing the same.

BACKGROUND OF THE INVENTION

To reduce the cost for manufacturing liquid crystal panel, a liquid crystal panel with an HSD structure emerges. The number of gate lines is doubled and the number of data lines is halved in the panel, thus the number of chips for driving the data lines is reduced, which reduces the cost accordingly.

When the liquid crystal panel is designed, in order to avoid insufficient pixel charge caused by the resistance-capacitance delay effect of the gate lines, the gate lines are normally designed wide. Since the number of the gate lines of the liquid crystal panel with the HSD structure is doubled, and the widths of the gate lines are increased at the same time, the areas of pixel regions of the liquid crystal panel are reduced, which reduces the aperture ratio, and thus impacts on the penetration rate of the pixels.

Based on the above, there is a need for providing a liquid crystal panel design which is in HSD structure and may simultaneously improve the penetration of the pixels.

SUMMARY OF THE INVENTION

To solve the above problems, the present disclosure provides a liquid crystal panel design with HSD structure which may improve the penetration rate of pixels at the same time.

According to an aspect of the present disclosure, a TFT-LCD display panel based on an HSD structure is provided, which includes:

a sub-pixel unit array;

a plurality of pairs of gate lines, with each pair being arranged between two adjacent rows of sub-pixel units, wherein each gate line includes subsections which are arranged repeatedly and each subsection consists of portions with different widths, the TFT element is connected with a pixel electrode of a sub-pixel unit being placed on the subsection portion having a relatively large width; and a plurality of data lines, perpendicular to the gate lines, wherein two or more columns of sub-pixel units are arranged between two adjacent data lines.

According to an embodiment of the present disclosure, each subsection includes a first subsection portion and a second subsection portion, wherein the first subsection portion is wider than the second subsection portion.

According to an embodiment of the present disclosure, each pair of gate lines is arranged such that the first subsection portion of one gate line is opposite to the second subsection portion of the other gate line, and the second subsection portion of the gate line is opposite to the first subsection portion of the other gate line, thereby the width of each pair of gate lines along the row direction of pixel units being uniform.

According to an embodiment of the present disclosure, the first subsection portion and the second subsection portion are combined such that one side of the subsections at the combining position is flush.

According to an embodiment of the present disclosure, the first subsection portion and the second subsection portion are combined such that both sides of the subsection are not flush at the combining positions, such that the sub-pixel units surrounded by two pairs of gate lines are staggered with each other along the horizontal direction.

According to an embodiment of the present disclosure, the data lines are spaced from the areas at which the sources of the TFT elements on the gate lines are located, and each data line is respectively connected with the source of each TFT element through a corresponding one of lead wire extending from the data line.

According to an embodiment of the present disclosure, the data line is designed to pass through the portion of the subsections of the gate lines on which the TFT element is arranged and serve as the source of the TFT.

According to another aspect of the present disclosure, a method for manufacturing a TFT-LCD display panel based on an HSD structure is further provided, including the following steps of:

providing a substrate, patterning on the substrate to form a layer of gate lines, wherein the patterned layer includes a plurality of pairs of gate lines arranged in the horizontal direction, each gate line consists of a multiple of subsections arranged repeatedly, wherein each subsection includes portions with different widths, and different pairs of gate lines are spaced from each other for a certain distance, the two gate lines in the pairs of gate lines being arranged closely but in electrical isolation;

depositing a semiconductor material on the wider portion of subsections of the gate lines having a relatively large width to form a semiconductor layer;

forming a plurality of data lines and forming source electrodes and drain electrodes of TFT elements on the semiconductor layer, wherein the data lines formed therein are spaced from each other and vertically crossed by the plurality of pairs of gate lines, and the source electrodes and drain electrodes are formed on the semiconductor layer;

forming a passivation layer on the layer of data lines; and manufacturing two or more sub-pixel electrodes in a space encircled by any adjacent two pairs of gate lines and any adjacent two data lines.

According to an embodiment of the present disclosure, each subsection of each formed gate line includes a first subsection portion and a second subsection portion, wherein the first subsection portion is wider than the second subsection portion, each pair of gate lines is arranged such that the first subsection portion of one gate line is opposite to the second subsection portion of the other gate line, and the second subsection portion of the gate line is opposite to the first subsection portion of the other gate line, which enables the width of each pair of gate lines along the row direction of pixel units wholly uniform.

According to an embodiment of the present disclosure, when patterning to form the gate lines, forming the first subsection portions and the second subsection portions in such a manner that the subsections are flush to each other on one side of the subsections at the combining positions.

According to an embodiment of the present disclosure, during the formation of the data lines, the data lines are designed to pass through the semiconductor material layer previously formed on the gate lines, and this portion of data lines passing through the gate lines are used as the source electrodes of the TFT elements.

The present disclosure has advantages as follows:

the gate lines in the present disclosure are formed by combining the subsections with different widths in a repeated manner, the TFT elements connected with the pixel electrodes of the sub-pixel units are arranged on the wider portions, and the narrower portions may be designed as narrow as possible, so that the total width of two gate lines may be reduced; meanwhile, the TFT elements are arranged on the gate lines rather than pixel regions, which caused the aperture ratio of the pixel regions increased, and thus the penetration of pixels improved.

Other features and advantages of the present disclosure will be set forth in the following description, and partially will be made obvious from the description, or be learned by implementing the present disclosure. The objectives and other advantages of the present disclosure may be achieved and obtained by structures particularly pointed out in the description, the claims and the accompanying drawings.

BRIEF DESCRIPTION OF THE DRAWINGS

To illustrate technical solutions in the embodiments of the present disclosure or in the prior art more clearly, a brief introduction on the accompanying drawings which are needed in the description of the embodiments or the prior art is given below.

DETAILED DESCRIPTION OF THE EMBODIMENTS

A detailed description of the implementation of the present disclosure will be given below, in combination with the accompanying drawings and embodiments. Therefore, an implementation process of how to use technical means of the present disclosure to solve technical problems and achieve a technical effect may be fully understood and implemented accordingly. It should be noted that, as long as no conflict is generated, various embodiments of the present disclosure and various features of the embodiments may be combined with each other, and the formed technical solutions are all within the protection scope of the present disclosure. Terms used herein, such as "upper", "lower", "front", "rear" and the like, are not used for limiting the structure position of each composition portion.

Moreover, in the following description, some specific details, such as length, width, shape and the like are provided for comprehensively understanding the embodiments of the present disclosure. However, those skilled in the art should understand that, the present disclosure may be realized without one or more specific details above or may be realized by adopting other methods, components, materials and the like. In other examples, known structures, materials or operations are not shown or described in detail to avoid obscuring each aspect of the present disclosure.

Figure 1:
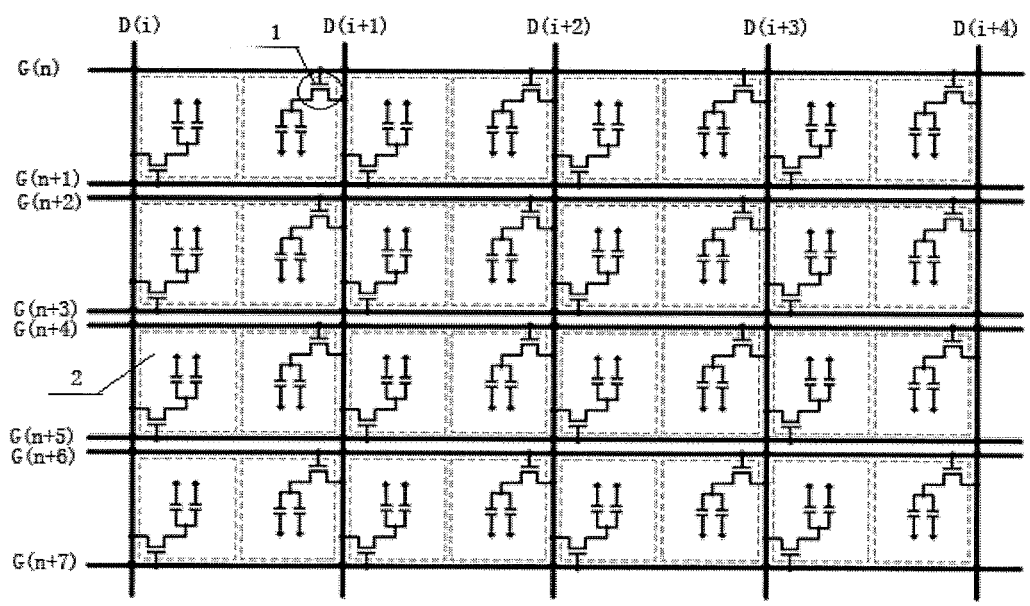
FIG. 1 is a diagram showing a traditional display panel with an HSD structure.

At the present, liquid crystal display panel is designed to be with an HSD structure, in which the quantity of gate lines is doubled, and the quantity of data lines is correspondingly reduced by half. Compared with a traditional liquid crystal display panel structure, the total quantity of signal lines in a display panel with an HSD structure is obviously reduced, so that the quantity of data lines driving chips is reduced, and the purpose of reducing the manufacturing cost is finally fulfilled. As shown in FIG. 1, it shows the traditional display panel with the HSD structure, wherein gate lines are arranged along the horizontal direction and data lines are arranged along the vertical direction in the panel. Regions encircled by the gate lines and the data lines are pixel regions. Each pixel region includes two sub-pixel units, each of which is provided with a switching element (TFT) marked as 1 in FIG. 1. A plurality of sub-pixel units form a sub-pixel unit array.

With the increase of size of the liquid crystal display panel, resistance and parasitic capacitance of wiring on the panel are quickly increased. Accordingly, it is normal to widen the width of wires when designing the panel, so as to reduce the load. Thus, the areas of light transmission of the pixel regions are reduced, namely the aperture ratio is reduced, and then the penetration of pixels is reduced. For the panel with the HSD structure in which the number of gate lines is doubled, this kind of problem is becoming severe.

To improve the penetration of pixels of a TFT-LCD display panel with an HSD structure, the present disclosure proposes a new design of the TFT-LCD display panel with the HSD structure.

Figure 2:
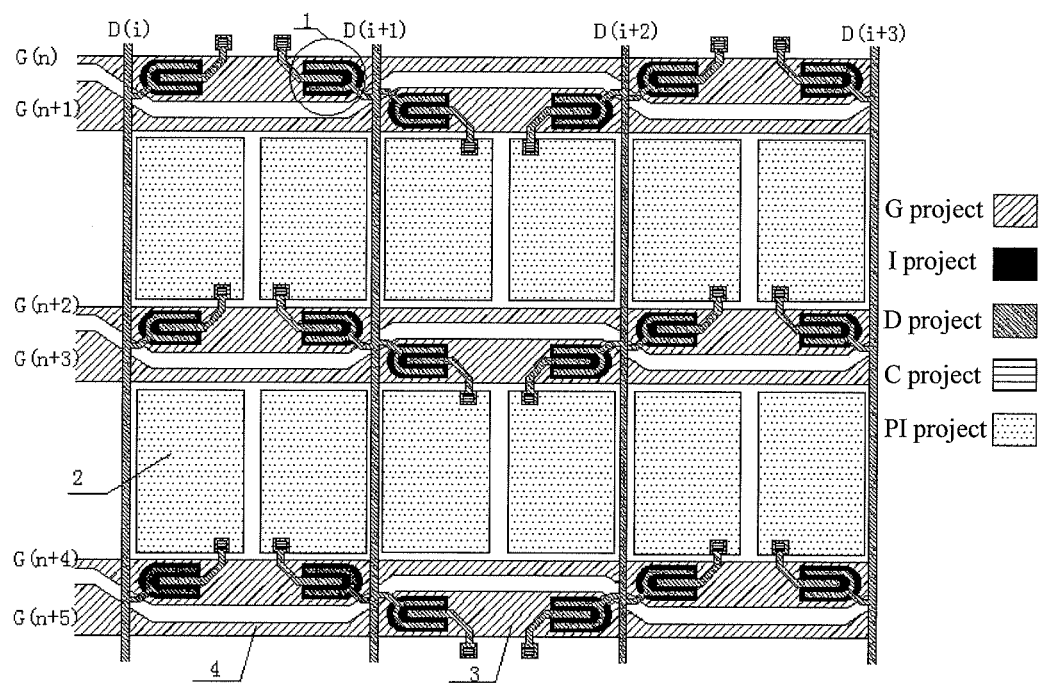
FIG. 2 is a diagram showing a display panel according to a first embodiment of the present disclosure.

FIG. 2 shows a schematic diagram of a first embodiment of the present disclosure.

Gate lines, marked as G(n) in the figure, are arranged in multiple rows and in pairs along the horizontal direction. A sub-pixel unit array is arranged between each pair of gate lines. Each gate line is formed by subsections arranged repeatedly and having different widths. Each subsection includes a first subsection portion and a second subsection portion. As shown in FIG. 2, symbol 3 indicates the first subsection portion, and symbol 4 indicates the second subsection portion. The first subsection portion is wider than the second subsection portion. The first subsection portion of one gate line in each pair of gate lines is opposite to the second subsection portion of the other gate line, and the second subsection portion of the gate line is opposite to the first subsection portion of the other gate line. The first subsection portions and second subsection portions of each pair of gate lines form a complementary structure, so as to enable the width of each pair of gate lines wholly uniform along the row direction of pixel units.

As shown in FIG. 2, in this embodiment, the first subsection portions are flush to the second subsection portions at one side of the joint position, so that the sub-pixel units on the same row are arranged in the horizontal direction. In this case, the shapes of sub-pixel units are regular, and the sub-pixel are easily matched with each other to avoid the occurrence of dark lines as possible.

As shown in FIG. 2, there are a multiple columns of data lines, marked as D(i). The data lines are arranged perpendicular to the gate lines, and two columns of sub-pixel units are arranged between two adjacent data lines.

Figure 3:
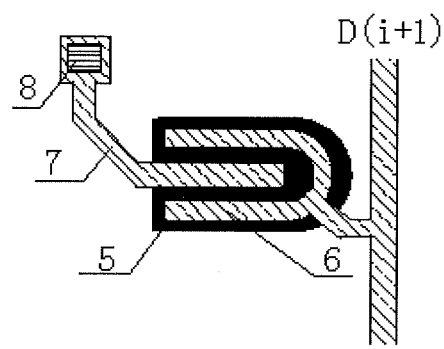
FIG. 3 is a diagram showing an arrangement structure of a TFT electrode in FIG. 2.

Again, as shown in FIG. 2, switching elements TFT, which are connected with pixel electrodes in the sub-pixel units, are arranged on the first subsection portions of the gate lines in this embodiment. Thus, the widths of the first subsection portions need to meet the requirement that the TFTs can be formed thereon. While, the second subsection portion will not the TFTs be arranged, therefore the widths of the second subsection portions can be reduced to the minimum, which make the total width of two gate lines arranged in pairs reduced, and thus make the areas of pixel regions enlarged. The TFTs are arranged in the first subsection portions of the gate lines rather than in the pixel regions, so that the TFTs may be prevented from occupying the areas of the pixel regions, the light transmission regions of pixels are increased, and thus the aperture ratio and penetration of the pixels are improved. The regions where the sources of the TFTs are located are spaced from the corresponding data lines, and the both are connected with each other through leads. The drains of the TFTs are connected with the pixel electrodes through leads. As shown in FIG. 3, it shows an amplified diagram of the source electrode, drain electrode and gate electrode of a switching element TFT marked as 1 in FIG. 2, and connections with data lines and pixel electrodes.

Figure 4:
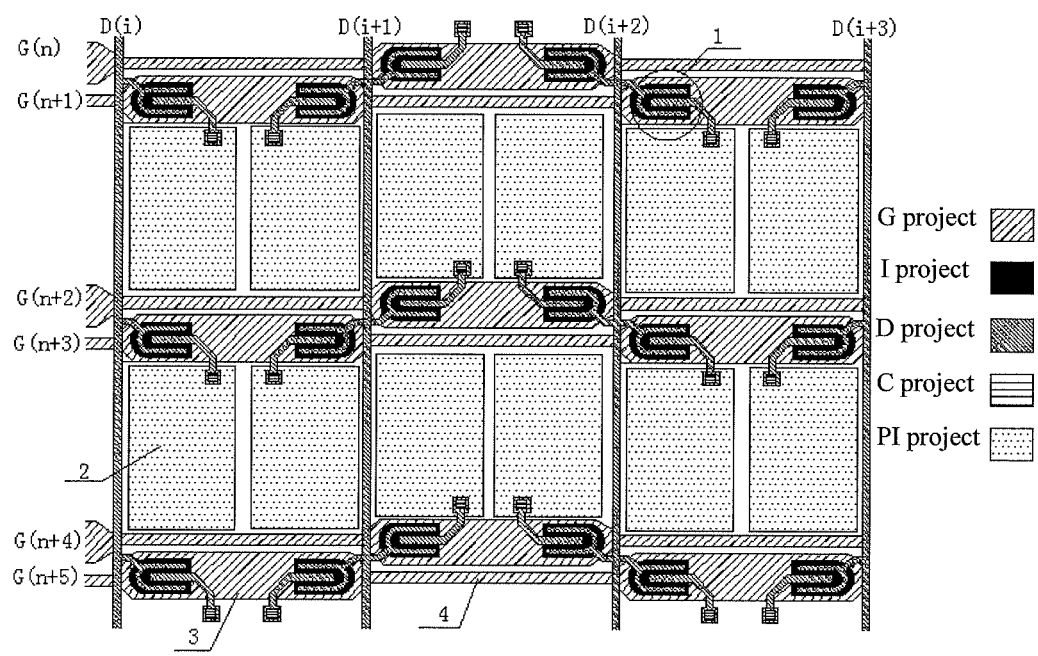
FIG. 4 is a diagram showing a display panel according to a second embodiment of the present disclosure.

As shown in FIG. 4, it shows a schematic diagram of a second embodiment of the present disclosure.

Compared with the first embodiment of the present disclosure, the wiring structures of the gate lines and the data lines of this embodiment are totally identical. The difference from the first embodiment lies in that, due to different setting of the portions of the gate lines, the first subsection portion and the second subsection portion are not flush to each other on two sides of the joint positions, so that the sub-pixel units on the same row are not on the same horizontal line. The sub-pixel units encircled by four gate lines and two data lines are arranged in a vertical staggered manner along the horizontal direction, with the arrangement shape like sawtooth. Although the sub-pixel units are not arranged on the same horizontal line in this embodiment and have different layouts, it can achieve the same display effect to the first embodiment.

Figure 5:
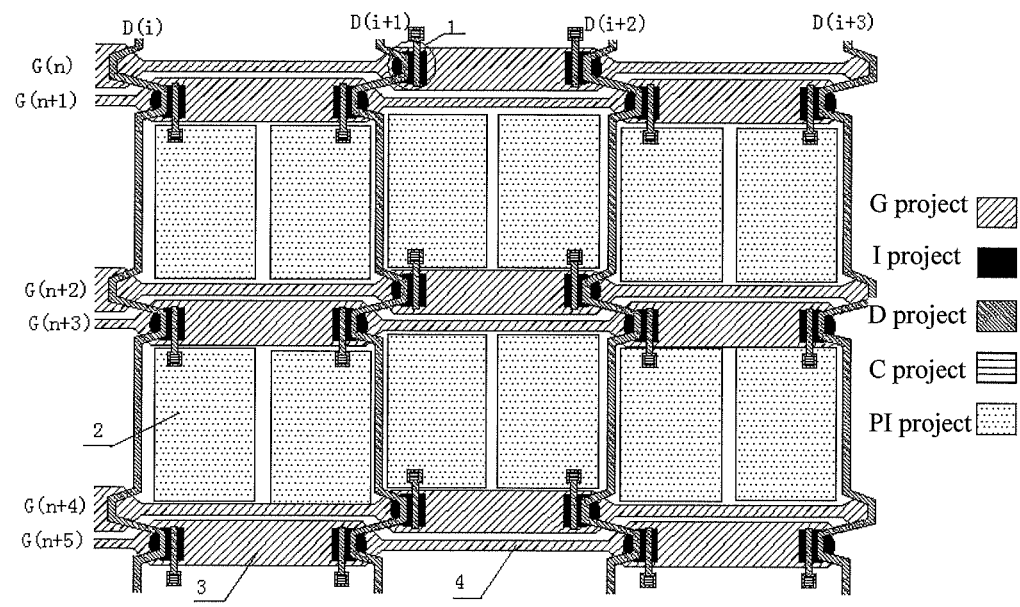
FIG. 5 is a diagram showing a display panel according to a third embodiment of the present disclosure.

An FIG. 5, it schematically shows a diagram of a third embodiment of the present disclosure.

Compared with the second embodiment of the present disclosure, the shape and arrangement of the gate lines in this embodiment are completely identical. The difference lies in setting of a TFT. As shown in FIG. 5, each data line is directly introduced to a region where the source of the TFT is located on the first subsection portion of a gate line and used as the source of the TFT. This design may reduce the size of each TFT and reduce the width of the first subsection portion of the TFT, so as to enlarge the area of each pixel region and further improve the aperture ratio and penetration of pixels. The design of the data lines is not limited to the second embodiment above, and may be adopted by the first embodiment of the present disclosure and other liquid crystal display panels with similar connecting manners of switching elements and data lines.

Taking the first embodiment as an example, the TFT-LCD display panel is manufactured by the following steps.

Firstly, a required glass substrate is selected and cleaned.

Secondly, G project manufacturing is performed, and this project is used for forming patterns related to scan lines. A G metal layer with certain thickness for generating gate line patterns is formed on the glass substrate in a sputtering manner. A layer of positive PR (photoresist) is coated on the metal layer. When the gate line patterns are formed on the metal layer, a corresponding G-MASK (G mask) is adopted for exposure. On the G-MASK, lightproof regions corresponding to the gate line patterns are formed by combining subsections with different widths. Each subsection includes a first subsection portion with a wider width and a second subsection portion with a narrower width. The first subsection portion of a lightproof region is opposite to the second subsection portion of an adjacent lightproof region, the second subsection portion of the lightproof region is opposite to the first subsection portion of the adjacent lightproof region, and the two lightproof regions form a complementary structure, so that the width of each pair of lightproof regions is uniform along the direction of rows. The first subsection portion and second subsection portion of the lightproof region are flush to each other on one side of the joint position. Later, through developing, wet etching and PR peeling, a gate line G pattern layer with first subsection portions and the second subsection portions arranged repeatedly and one flush side is obtained. The pattern layer is marked as G as shown in FIG. 2.

Then, I project manufacturing is performed, and this project is used for forming patterns related to TFT channels of a semiconductor layer. The substrate obtained by the G project is cleaned, and a first layer of SiNx film (silicon nitride film) is generated by using a CVD (chemical vapor deposition) film forming process. After cleaning the substrate again, a second layer of SiNx film, an intrinsic a-Si film (amorphous silicon film) and an n+a-Si film (P-doped amorphous silicon film) are generated by continuously adopting the CVD film forming process. Then a layer of PR is coated and exposed by adopting a corresponding I-MASK (I mask). Lightproof regions of the I-MASK correspond to TFT portions arranged on the wider first subsection portions of the gate lines, and then a TFT gate I pattern layer arranged on the wider first subsection portions of the gate lines is obtained through developing, dry etching and PR peeling. The pattern layer is marked as I, shown as in FIG. 2.

Next, D project manufacturing is performed, and this project is used for forming patterns related to data lines. The substrate obtained by the I project is cleaned, a D metal layer is formed in a sputtering manner, and the metal layer is used for forming sources and drains of TFTs and data lines. A layer of PR is coated on the D metal layer, and exposed by adopting a D-MASK (D mask). Source and drain portions of TFT and data port portions correspond to lightproof regions on the D-MASK. Later, a D pattern layer containing sources and drains of TFT and data lines is obtained through developing, wet etching and PR peeling. The pattern layer is marked as D, shown as in FIG. 2.

Then, C project manufacturing is performed, and this project is used for generating contact hole patterns. The substrate obtained by the D project is cleaned, and a passivation layer is generated by using the CVD film forming process. A layer of PR is coated on the passivation layer and exposed to irradiate the positions at which pixel electrodes and terminals of lines are connected by adopting a C-MASK (C mask), so as to form the contact hole patterns. Herein, the C mask is opposite to the other mask. Later, a C pattern layer with contact holes is obtained through developing, dry etching and PR peeling. The pattern layer is marked as C, shown as in FIG. 2.

Finally, PI project manufacturing is performed, and this project is used for generating pixel electrodes. The substrate obtained by the C project is cleaned, and an ITO (indium tin oxide) film with certain thickness is formed in the sputtering manner. A layer of PR is coated and exposed by adopting a PI-MASK (PI mask), and the IP-MASK herein is provided with lightproof regions where ITO patterns need to be left. Later, a PI pattern layer with sub-pixel electrodes is obtained through developing, wet etching and PR peeling. The pattern layer is marked as PI, shown as in FIG. 2.

The process flow of manufacturing the TFT-LCD display panel of the second embodiment is different from that of manufacturing the display panel of the first embodiment in the G project. In the G project manufacturing process of the second embodiment, the corresponding G-MASK is provided with different lightproof regions, so that the first subsection portions and the second subsection portions of the gate lines are not flush to each other on two sides of the joint positions. Thus, the sub-pixel units on the same row are not on the same horizontal line, and are arranged horizontally in a vertical staggered manner, with a shape like sawtooth.

The process flow of manufacturing the TFT-LCD display panel of the third embodiment is different from that of manufacturing the panel of the second embodiment in the D project step. In this embodiment, the setting direction of the data lines is changed, and the data lines are introduced to the semiconductor layer where the sources of TFTs are located and used as the sources of the TFTs.

It is understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Although the above-mentioned examples are used for illustrating the principles of the present disclosure in one or more applications, for those skilled in the art, various modifications may be made on forms, use methods and details of implementation obviously without any creative effort under the condition of not deportioning from the principles and thoughts of the present disclosure. Therefore, the present disclosure is defined by the appended claims.

LIST OF REFERENCE SIGNS

1—switching element (TFT);
2—sub-pixel unit;
3—first subsection portion;
4—second subsection portion;
5—TFT gate;
6—TFT source;
7—TFT drain;
8—contact hole (a portion for connecting TFT drain and pixel electrode).

What is claimed is:

1. A TFT-LCD display panel based on an HSD structure, including:
a sub-pixel unit array;
a plurality of pairs of gate lines with each pair being arranged between two adjacent rows of the sub-pixel units, wherein each gate line includes subsections arranged repeatedly and each subsection includes a first subsection portion and a second subsection portion, and the first subsection portion is wider than the second subsection portion, a TFT element connected with a pixel electrode of the sub-pixel unit being placed on the first subsection portion; and
a plurality of data lines perpendicular to the gate lines, wherein two or more columns of sub-pixel units are arranged between two adjacent data lines.

2. The TFT-LCD display panel as recited in claim 1, wherein each pair of gate lines is arranged such that the first subsection portion of a first gate line is opposite to the second subsection portion of a second gate line, and the second subsection portion of the first gate line is opposite to the first subsection portion of the second gate line, thereby the width of each pair of gate lines along the row direction of pixel units is uniform.

3. The TFT-LCD display panel as recited in claim 2, wherein the first subsection portion and the second subsection portion are combined such that one side of the subsections at the combining position is flush.

4. The TFT-LCD display panel as recited in claim 2, wherein the first subsection portion and the second subsection portion are combined such that both sides of the subsections at the combining position are not flush, such that the sub-pixel units surrounded by two pairs of gate lines are staggered with each other along the horizontal direction.

5. The TFT-LCD display panel as recited in claim 1, wherein the data lines are spaced from areas at which sources of the TFT elements on the gate lines are located, and the data lines are respectively connected with a source of each of the TFT elements via a corresponding one of lead wires extending from the data lines.

6. The TFT-LCD display panel as recited in claim 1, wherein the data line is arranged to pass through the subsection portion of the gate lines on which the TFT element is placed, and serves as a source of the TFT element.

7. The TFT-LCD display panel as recited in claim 1, wherein the data line is arranged to pass through the subsection portion of the gate lines on which the TFT element is placed, and serves as a source of the TFT element.

8. The TFT-LCD display panel as recited in claim 2, wherein the data line is arranged to pass through the subsection portion of the gate lines on which the TFT element is placed, and serves as a source of the TFT element.

9. The TFT-LCD display panel as recited in claim 3, wherein the data line is arranged to pass through the subsection portion of the gate lines on which the TFT element is placed, and serves as a source of the TFT element.

10. The TFT-LCD display panel as recited in claim 4, wherein the data line is arranged to pass through the subsection portion of the gate lines on which the TFT element is placed, and serves as a source of the TFT.

11. A method for manufacturing a TFT-LCD display panel based on an HSD structure, including steps of:
providing a substrate,
patterning on the substrate to form a layer of gate lines, wherein the patterned layer includes a plurality of pairs of gate lines arranged in the horizontal direction, with each gate line consisting of a multiple of subsections arranged repeatedly, wherein each subsection includes a first subsection portion and a second subsection portion, the first subsection portion being wider than the second subsection portion, and different pairs of gate lines are spaced from each other for a certain distance, the two gate lines in the pairs of gate lines being arranged closely but in electrical isolation;
depositing semiconductor materials on the first subsection portion to form a semiconductor layer;
forming a plurality of data lines and forming source electrodes and drain electrodes of TFT elements on the semiconductor layer, wherein the data lines formed therein are spaced from each other and vertically crossed by the plurality of pairs of gate lines, and the source electrodes and drain electrodes are formed on the semiconductor layer;
forming a passivation layer on the layer of data lines; and
manufacturing two or more sub-pixel electrodes in a space encircled by any adjacent two pairs of gate line and any adjacent two data lines.

12. The method as recited in claim 11, each pair of the gate lines is arranged such that the first subsection portion of a first gate line is opposite to the second subsection portion of a second gate line, and the second subsection portion of the first gate line is opposite to the first subsection portion of the second gate line, which enables the width of each pair of gate lines along the row direction of pixel units to be wholy uniform.

13. The method as recited in claim 12, wherein, when patterning to form the gate lines, forming the first subsection portions and the second subsection portions in such a manner that the subsections are flush to each other on one side of the subsections at the combining positions.

14. The method as recited in claim 11, wherein during the formation of the data lines, the data lines are designed to pass through the semiconductor material layer previously formed on the gate lines, and this portion of data lines passing through the gate lines are used as the source electrodes of the TFT elements.

15. The method as recited in claim 12, wherein during the formation of the data lines, the data lines are designed to pass through the semiconductor material layer previously formed on the gate lines, and this portion of data lines passing through the gate lines are used as the source electrodes of the TFT elements.

16. The method as recited in claim 13, wherein during the formation of the data lines, the data lines are designed to pass through the semiconductor material layer previously formed on the gate lines, and this portion of data lines passing through the gate lines are used as the source electrodes of the TFT elements.

* * * * *